United States Patent
Sigwanz et al.

Patent Number: 6,049,617
Date of Patent: Apr. 11, 2000

[54] METHOD AND CIRCUIT FOR GAIN CONTROL IN DIGITAL HEARING AIDS

[75] Inventors: Ullrich Sigwanz, Erlangen; Fred Zoels, Altenthann, both of Germany

[73] Assignee: Siemens Audiologische Technik GmbH, Erlangen, Germany

[21] Appl. No.: 08/927,723

[22] Filed: Sep. 11, 1997

[30] Foreign Application Priority Data

Oct. 23, 1996 [EP] European Pat. Off. .............. 96117024

[51] Int. Cl.⁷ .................................................. H04R 25/00
[52] U.S. Cl. ........................ 381/312; 381/321; 455/234.2
[58] Field of Search ................................ 381/312, 321, 381/317, 316, 320, 94.1, 94.9; 455/234.1, 234.2, 235.1, 242.1, 249.1

[56] References Cited

U.S. PATENT DOCUMENTS

| | | |
|---|---|---|
| 4,187,413 | 2/1980 | Moser . |
| 4,792,977 | 12/1988 | Anderson et al. ...................... 381/321 |
| 4,852,175 | 7/1989 | Kates . |
| 5,016,205 | 5/1991 | Shumway . |
| 5,412,735 | 5/1995 | Engebretson et al. ................... 381/320 |
| 5,530,767 | 6/1996 | Yoshida . |
| 5,838,806 | 11/1998 | Sigwanz et al. ........................ 381/312 |

FOREIGN PATENT DOCUMENTS

| | | |
|---|---|---|
| 0 633 658 A2 | 1/1995 | European Pat. Off. . |
| 34 40 722 A1 | 5/1987 | Germany . |
| 43 40 817 A1 | 6/1995 | Germany . |

*Primary Examiner*—Curtis A. Kuntz
*Assistant Examiner*—Phylesha Dabrey
*Attorney, Agent, or Firm*—Hill & Simpson

[57] ABSTRACT

A method and circuit for signal amplification in digital hearing aids, in particular in hearing aids with automatic gain control (AGC). In the method there first ensues a digitization of an input signal from the signal path of the hearing aid, then a rectification of sampled values of the digitized input signal. Next a determination of gain values is allocated to the sampled values, after which there is a smoothing of the gain values. Finally, after previous allocation of the smoothed gain values to the sampled values, allocated values, reconverted to analog form, are outputted into the signal path of the hearing aid.

20 Claims, 5 Drawing Sheets

METHOD AND CIRCUIT FOR GAIN CONTROL IN DIGITAL HEARING AIDS

BACKGROUND OF THE INVENTION

The present invention relates to a method and a circuit for signal amplification in digital hearing aids, in particular in hearing aids with automatic gain control (AGC).

As prior art, it is known to use algorithms for the amplification of input signals in digital hearing aids, which algorithms simulate the charging and discharging behavior of an AGC capacitor element in an analog hearing aid. The sampled values obtained from analog input signal values by digitization are compared with a stored mean sampled value, and, if necessary, are smoothed in case of deviation from this mean sampled value. The waviness of the sampled values is thereby reduced. Corresponding stored gain values are thereupon allocated to the smoothed sampled values. By combining these gain values with the possibly pre-processed sampled signal values, different kinds of signal compressions, signal expansions, or a combination of the two can be produced. After reconverting the sampled digital signal to analog, a correspondingly amplified output signal results.

However, a substantial and undesirable increase in the harmonic distortion of the output signal in relation to the input signal is to be noted with such a smoothing and subsequent amplification of the input signal.

SUMMARY OF THE INVENTION

It is an object of the present invention to provide a method and a circuit for signal amplification in digital hearing aids in which the harmonic distortion remains essentially unaltered.

The inventive method first acquires a sampled input signal from the signal path of the hearing aid, and rectifies this signal, e.g. by absolute value formation or squaring. For signal amplification, corresponding gain values are now allocated to the sampled values. After transformation of the sampled input signal into a series of gain values, there ensues a smoothing of the gain values. The resulting smoothed gain values are now combined with the sampled values, are converted to analog, and are fed back into the signal path of the hearing aid as an output signal.

The output signal, amplified in relation to the input signal in this way, has substantially unchanged harmonic distortion in comparison to the input signal, so that a distortion-free automatic signal gain control is ensured.

In the prior art, a smoothing of the signal takes place before the determination of the amplification. Since corresponding stepped amplification values are allocated to the individual sampled values of the smoothed input signal, more or less large jumps in amplification occur in the amplification of the sampled values, dependent on the fineness of the stepping of the gain values, which jumps lead to a signal deformation and thus to an undesired increase in harmonic distortion.

By means of the smoothing of the gain values allocated to the rectified sampled values, the inventive method achieves a signal amplification with a substantially or completely unaltered harmonic distortion, although, despite an unsmoothed input signal, strongly fluctuating sampled values and associated gain values occur. However, by means of the subsequent smoothing of the gain values, the amplification sought after is, surprisingly, achieved without a significant increase in harmonic distortion.

The corresponding gain values allocated to the rectified sampled values are advantageously stored in a data memory. A new type of amplification characteristic can thus ensue in a simple manner by means of storage of correspondingly modified gain values in the data memory.

The amplification realized by the invention without changing the harmonic distortion is already achieved with a storage in the data memory of only about 16 gain values allocated to the respective rectified sampled values.

Only a small memory capacity is thus required, and a new storing for the realization of a desired gain characteristic can ensue with a low time outlay.

For the realization of individual, refined gain characteristics, it can be advantageous to store a considerably larger number of gain values allocated to the respective sampled values, whereby an optimization of the inventive method is realized.

Advantageously, the gain values are allocated to the sampled values via an algorithm for automatic gain control (AGC), so that, for example, a lower amplification is realized in the middle and high input level range.

In order to adhere to the Shannon sampling theorem, it can be advantageous to carry out a squaring and smoothing of the digital sampled values before the determination of the gain values.

In an additional advantageous procedure, a dead time is to be provided between the decay of a preceding gain value and the building up of the subsequent gain value, in order to avoid an undesirable overlapping of the decay region of the preceding gain value into the buildup region of the subsequent gain value (e.g., in case of sine signals at a constant level).

A reliable separation of the decay process and the subsequent buildup process is achieved when the dead time arranged between two gain values corresponds to at least half the duration of the period of the lowest frequency of the input signal. By means of continuous frequency analysis or corresponding band limitation of the input signal, the corresponding dead times can be matched individually to the lowest frequency of the input signal.

For individual matching to the respective characteristic of the input signal, the buildup times, decay times and dead times that can be allocated to the individual gain values can be set individually. This can ensue during the programming of the hearing aid, but can also be carried out by the user of the hearing aid him/herself.

An additional improvement of the sound impression results if the dead time between the decay time and the buildup time of the individual gain values is reduced by means of the level of the input signal when a boundary value is exceeded.

Furthermore, a particularly pleasing sound impression results when the buildup time of the gain values is not less than 1 ms. For shorter buildup times, the sound impression is often perceived as unpleasant by the user.

In order to avoid overshooting in case of medium or long buildup times, the sampled values are advantageously allocated to the gain values with a delay. The corresponding longer buildup time can thereby be enabled for each gain value, and the gain value is not allocated to the sampled signal value until the gain value has built up completely. By means of suitable choice of the number of buffer elements for the delay circuit for the sampled signal values, a compromise can be reached between the overall delay time of the system and the quantity of the overshooting.

For the holding back and allocation with delay of the signal values to the gain values, a buffer element, in particular a ring buffer, is advantageously used, whereby a memory capacity of 16 values has proven sufficient for the buffer element for most cases of application.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENTS

Figure 1:
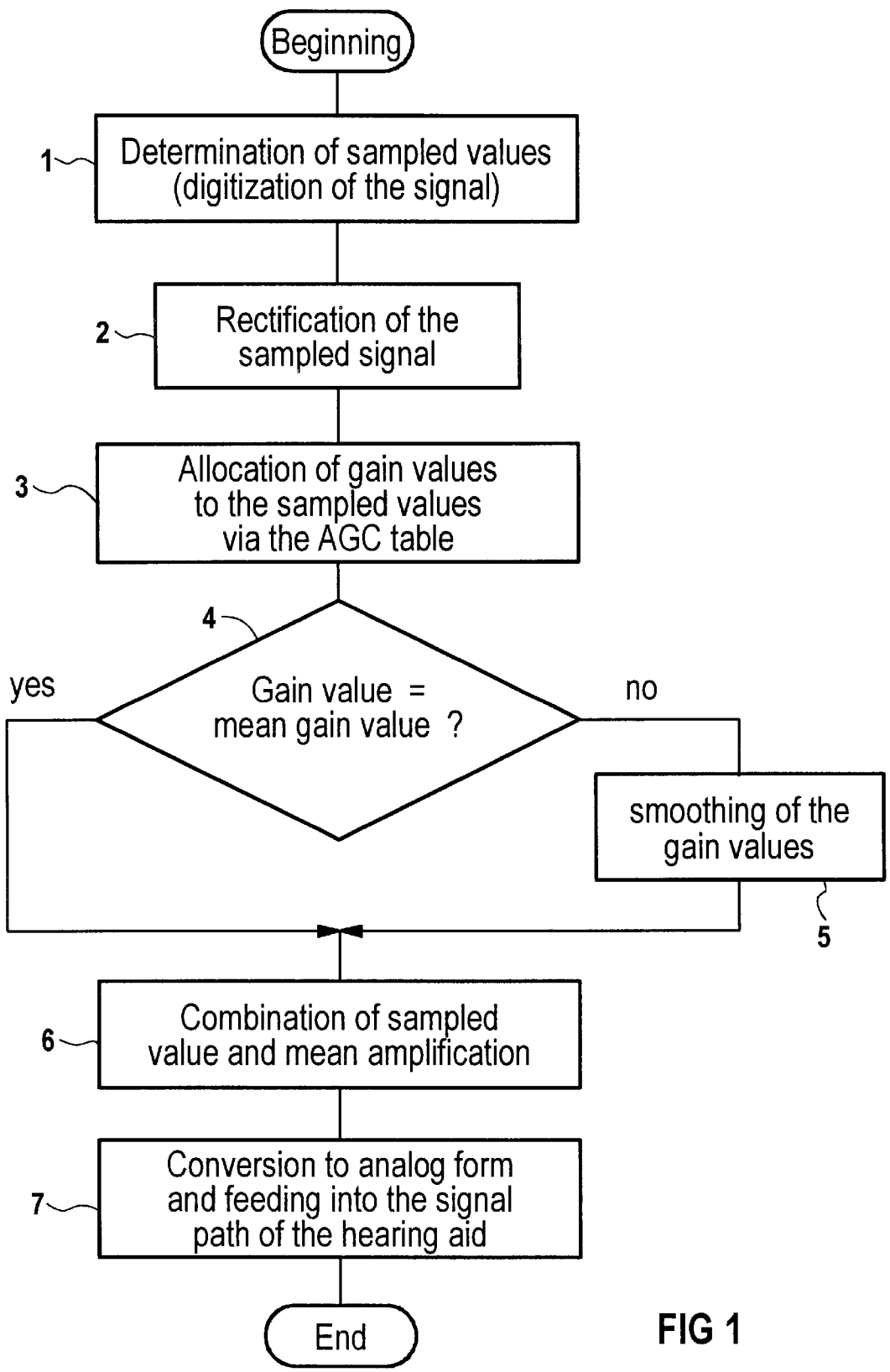
FIG. 1 is a flow diagram of the inventive method.

The flow diagram according to FIG. 1 has seven method steps, and, on the basis of the sampling of the analog input signal (step 1), depicts the rectification (step 2), and the allocation to the determined sampled values based on an AGC table containing stepped gain values according to a particular AGC characteristic (step 3).

In step 4, there ensues for each gain value a comparison with the previously stored gain value or with the mean gain value in the course of the method. A smoothing of the gain values ensues after step 5 if the respective gain values deviate from the mean gain values.

Finally, in step 7 the analog output signal is outputted as a conversion to analog form of the combination of the sampled values and the smoothed gain values (step 6).

In FIG. 1, the possible intermediate storing of the sampled values (after step 1) by a buffer element is not shown.

Figure 2:
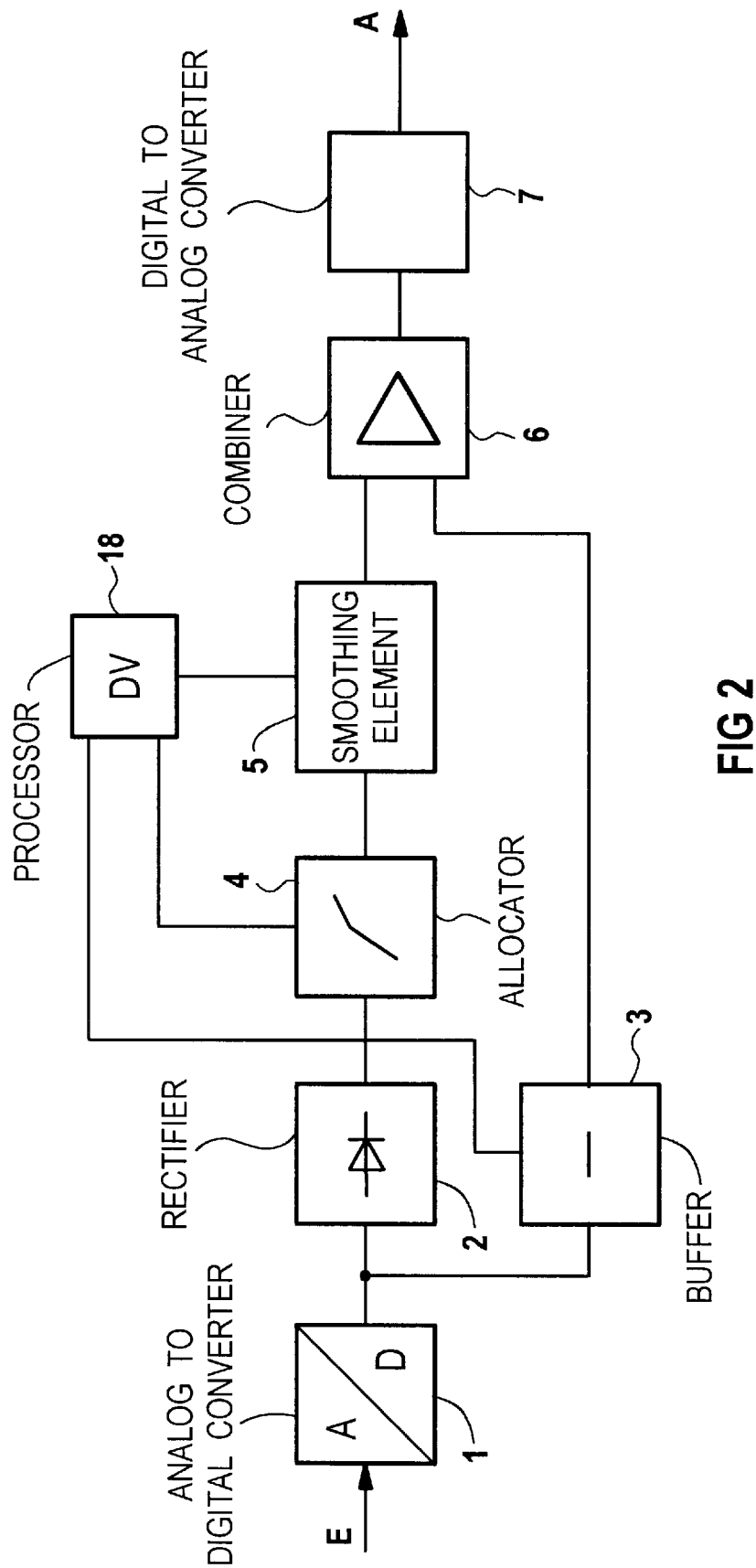
FIG. 2 is a block diagram of the inventive circuit.

The schematic diagram according to FIG. 2 is based on an input signal that is digitized by means of an A/D converter 1 in order to determine sampled values. The sampled values are stored in a buffer element 3 for intermediate storage, and are rectified by means of absolute value formation or squaring by a rectifier element 2. Gain values are allocated to these rectified signal values via an allocation element 4, in particular via allocations stored in an AGC table.

The allocated gain values are thereupon smoothed in the smoothing element 5, and are combined with the delayed sampled values by means of a combination element 6. After the sampled signal has been converted to analog form by means of a converter 7 for conversion to analog of the digitized values, an amplified signal A is then available, whereby the harmonic distortion of the signal remains essentially unaltered after amplification.

Via the data processing unit 18, which is used to control the allocation element 4, the buffer element 3 and the smoothing element 5, matched algorithms for amplification and for smoothing can be inputted, and parameters such as e.g. duration of the intermediate storing in the buffer element, buildup time, decay time and dead time of the gain values can be determined.

The smoothing of the gain values in the smoothing element 5 can take place by means of known statistical smoothing methods.

Figure 3:
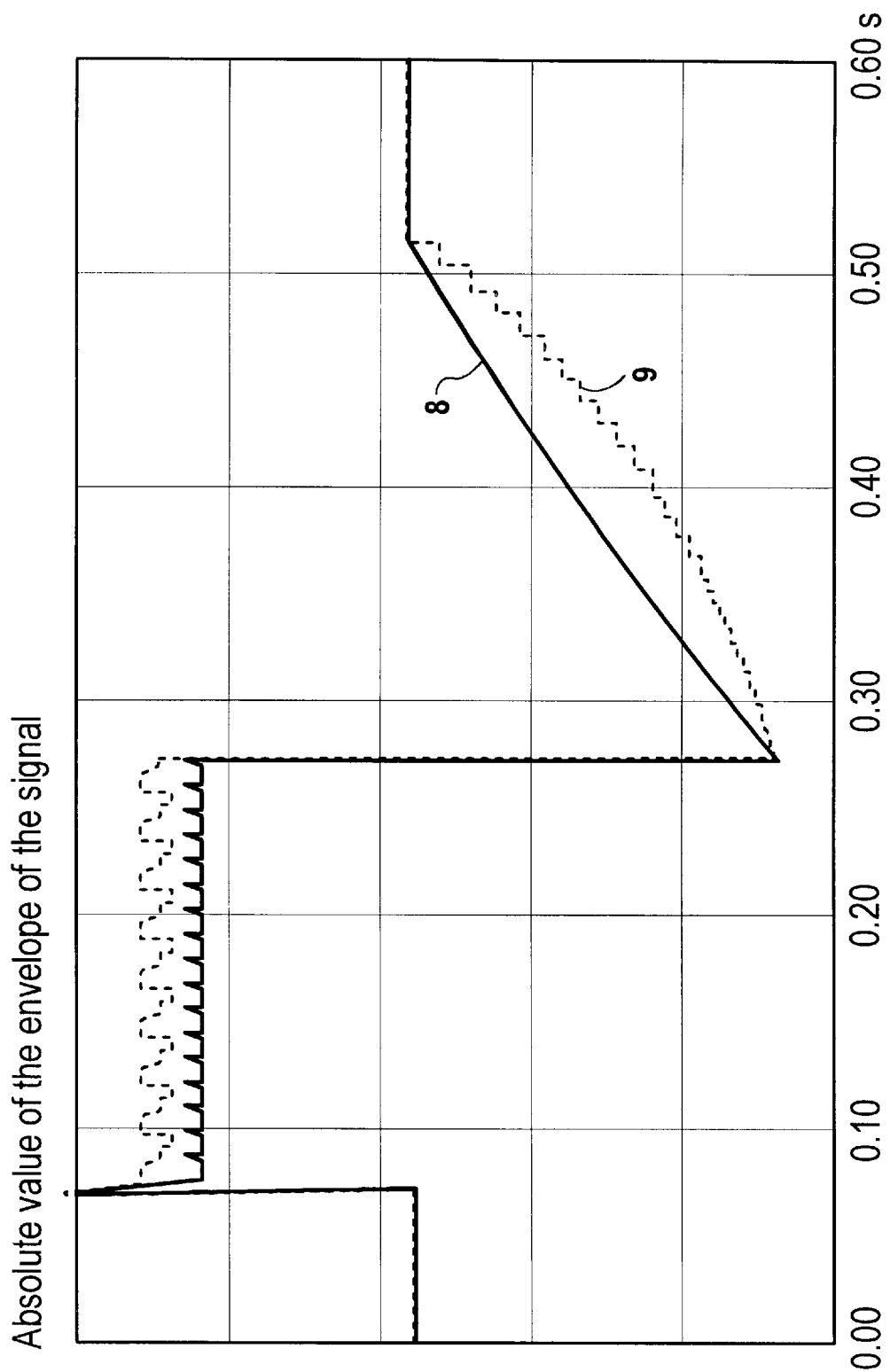
FIG. 3 depicts a comparison of the oscillation behavior between the inventive method and a prior art method.

On the basis of a sine impulse ("sine burst"), by means of plotting of the absolute value of the envelope of the processed signal over time FIG. 3 shows the signal amplification according to the curve 8 (see e.g. between 0.30 s and 0.50 s), which amplification is free of gain jumps according to the signal curve 9, in contrast to the conventional signal processing (according to the model of the simulated charge capacitor).

Figure 4:
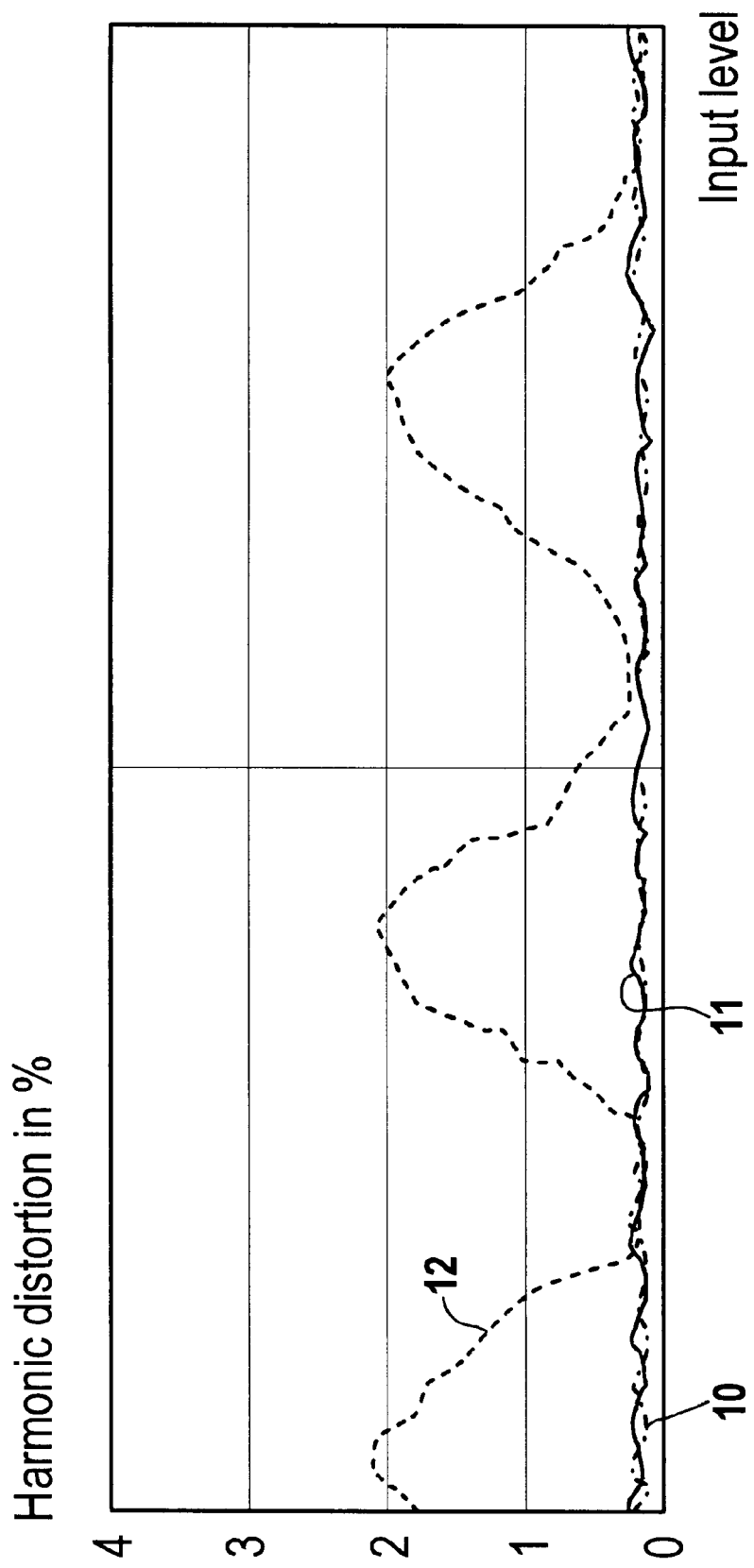
FIG. 4 depicts a comparison of the smoothing between the inventive method and a prior art method.

The advantageous smoothing effect of the inventive method also follows from FIG. 4, in which the harmonic distortion is plotted over the input level with static amplification. In contrast to the practically harmonic-distortion-free amplification by means of the inventive method according to the signal curve 10 (16 steps of the AGC table) and according to the signal curve 11 (64 steps of the AGC table), in conventional methods only harmonic distortion values of more than 2% were achieved.

Figure 5A:
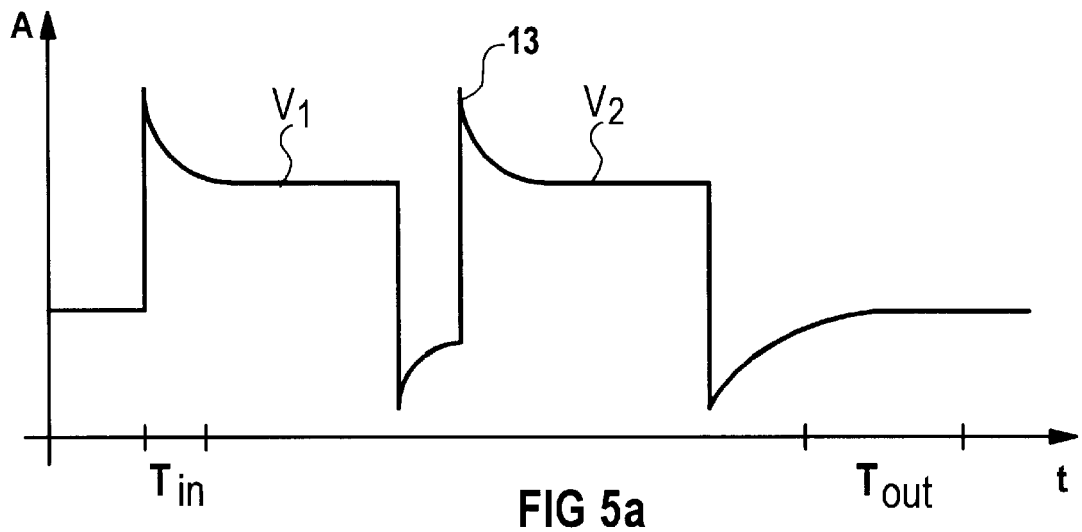
FIG. 5a depicts buildup times, without decay times.
Figure 5B:
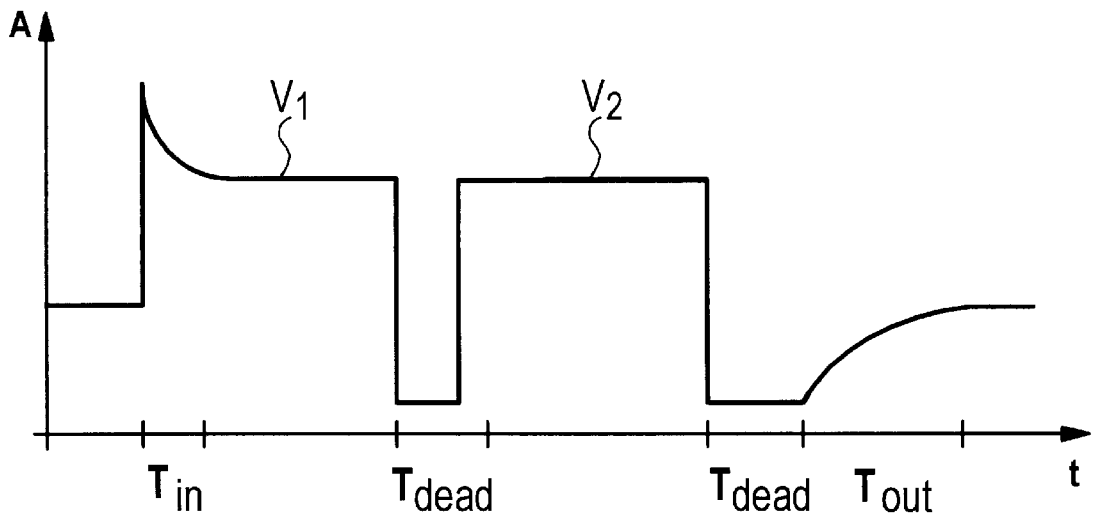
FIG. 5b depicts buildup times with dead times.

In FIG. 5a (without dead time) and FIG. 5b (with dead time), two gain values $V_1$ and $V_2$ are plotted over time. Between $V_1$ and $V_2$, the dead time $T_{dead}$ effects a reliable separation of the oscillation regions $V_1$ and $V_2$ (FIG. 5b). A buildup time $T_{in}$ thereby occurs only at the beginning of the first gain value $V_1$, and a decay time $T_{out}$ thereby occurs only at the end of a terminating gain value $V_2$ (FIG. 5b). In FIG. 5a, a disturbed transition occurs between $V_1$ and $V_2$, with oscillation peaks at the beginning of $V_2$.

In the following, a smoothing of a gain value is explained on the basis of a dimensionless numerical example.

In the terminology, a fictitious smoothing by means of a smoothing capacitor serves as the basis, whereby the smoothing capacitor has a fictitious charge constant, as well as a fictitious discharging constant.

The following quantities are assumed:

| | |
|---|---|
| Gain value | = 6 |
| Mean value$_1$ | = 4 |
| Fictitious charge constant | = 0.1 |
| Fictitious discharge constant | = 0.2 |

The smoothing algorithm for a change of the amplification to larger values consists of the equations (1)–(3):

| | |
|---|---|
| (1) Difference$_1$ = <br> gain value – mean value$_1$ | = 6 – 4 = 2 |
| (2) Fictitious charge contribution = <br> fictitious charge constant × <br> difference$_1$ | = 0.1 × 2 = 0.2 |
| (3) Mean value$_2$ = <br> mean value$_1$ + <br> fictitious charge contribution | = 4 + 0.2 = 4.2 |

Starting from the gain value 6, the smoothed gain value 4.2 results.

If the following quantities are assumed:

| | |
|---|---|
| Gain value | = 3 |
| Mean value$_1$ | = 4.2 |
| Fictitious charge constant | = 0.1 |
| Fictitious discharge constant | = 0.2 | then this effects a smoothing in the direction of smaller amplifications, which is described by the equations (4)–(6).

| | |
|---|---|
| (4) Difference$_1$ = <br> gain value – mean value$_1$ | = 3 – 4.2 = –1.2 |
| (5) Fictitious discharge contribution = <br> fictitious discharge constant × <br> difference$_1$ | = 0.2 × –1.2 = –0.24 |
| (6) Mean value$_2$ = <br> mean value$_1$ + <br> fictitious discharge contribution | = 4.2 – 0.24 = 3.96 |

Here the smoothed gain value 3.96 was determined, starting from the gain value 3.

The invention is not limited to the particular details of the method and apparatus depicted and other modifications and applications are contemplated. Certain other changes may be made in the above described method and apparatus without departing from the true spirit and scope of the invention herein involved. It is intended, therefore, that the subject matter in the above depiction shall be interpreted as illustrative and not in a limiting sense.

What is claimed is:

1. A method for signal amplification in digital hearing aids, in particular, in hearing aids with automatic gain control, comprising the steps of:
   a) determining digital sampled values of an input signal from a signal path of a hearing aid;
   b) rectifying the sampled values;
   c) allocating gain values to the rectified, sample values;
   d) smoothing the gain values;
   e) combining the sampled values from step a) with the gain values from step d) to provide combined values;
   f) converting the combined values to analog combined values and outputting the combined analog values into the signal path of the hearing aid.

2. The method according to claim 1, wherein at least one of the gain values allocated to the sampled values and the allocations to the sampled values are stored in a data memory.

3. The method according to claim 2, wherein the data memory has a selectable number of sampled values and respectively allocated gain values.

4. The method according to claim 1, wherein the gain values are allocated to the sampled values via an algorithm for automatic gain control.

5. The method according to claim 1, wherein the method further comprises smoothing the rectified sample values before determination of the gain values.

6. The method according to claim 1, wherein the method further comprises providing a dead time between an end of a preceding amplification and a beginning of a subsequent amplification.

7. The method according to claim 6, wherein the dead time corresponds to at least half a duration of a period of a lowest frequency of the input signal.

8. The method according to claim 6, wherein at least one of a buildup time, a decay time, and a dead time of a gain value is predeterminable.

9. The method according to claim 6, wherein the dead time is reduced when a boundary value of an input level of the input signal is exceeded.

10. A method for signal amplification in digital hearing aids, in particular, in hearing aids with automatic gain control, comprising the steps of:
   a) determining digital sampled values of an input signal from a signal path of a hearing aid;
   b) rectifying the sampled values;
   c) smoothing the rectified sample values;
   d) allocating gain values to the rectified, sample values via an algorithm for automatic gain control, each of the gain values having an order to magnitude of 1.0–1.5 ms;
   e) smoothing the gain values;
   f) combining the sampled values from step a) with the gain values from step d) to provide combined values;
   g) converting the combined values to analog combined values and outputting the combined analog values into the signal path of the hearing aid; and
   h) providing a dead time between an end of a preceding amplification and a beginning of a subsequent amplification.

11. The method according to claim 1, wherein allocation of the gain values to the sampled values is delayed, in order to enable a longer buildup time of the gain values.

12. The method according to claim 11, wherein a buffer element is provided for delaying intermediate storing of the sampled values.

13. The method according to claim 12, wherein memory capacity of the buffer element is adaptable to the buildup time.

14. The method according to claim 1, wherein at least one of the gain values and the sampled values are stored in a data memory, and wherein the data memory stores 16 sampled values and respectively allocated gain values.

15. A circuit for signal amplification in digital hearing aids, comprising:
   an analog to digital converter for determining sampled values of an analog input signal in the hearing aid;
   a rectifier element for rectification of the digitized input signal;
   a buffer element for a delaying intermediate storing of the sampled values;
   an allocation element for allocation of gain values to the sampled values;
   a smoothing element for smoothing of the gain values;
   a combination element for combining the smoothed gain values and the delayed sampled values to produce digitally amplified sampled values;
   a converter for converting the digitally amplified sampled values, into analog values; and
   a data processing unit for controlling the allocation element, the buffer element and the smoothing element;
   wherein the analog values are outputted to a signal path of the hearing aid.

16. A method for signal amplification in digital hearing aids, in particular, in hearing aids with automatic gain control, comprising the steps of:
   a) determining digital sampled values of an input signal from a signal path of a hearing aid;
   b) rectifying the sampled values;
   c) smoothing the rectified sample values;
   d) allocating gain values to the rectified, sample values via an algorithm for automatic gain control;
   e) smoothing the gain values;
   f) combining the sampled values from step a) with the gain values from step d) to provide combined values;
   g) converting the combined values to analog combined values and outputting the combined analog values into the signal path of the hearing aid; and
   h) providing a dead time between an end of a preceding amplification and a beginning of a subsequent amplification.

17. The method according to claim 16, wherein the dead time corresponds to at least half a duration of a period of a lowest frequency of the input signal.

18. The method according to claim 16, wherein at least one of a buildup time, a decay time, and a dead time of a gain value is predeterminable.

19. The method according to claim 16, wherein the dead time is reduced when a boundary value of an input level of the input signal is exceeded.

20. The method according to claim 16, wherein at least one of the gain values allocated to the sampled values and the allocations to the sampled values are stored in a data memory.

* * * * *